(12) United States Patent
Wenske et al.

(10) Patent No.: US 10,700,600 B2
(45) Date of Patent: Jun. 30, 2020

(54) DUTY CYCLE RANGE CONTROL FOR ENVELOPE TRACKING SWITCHING REGULATORS

(71) Applicant: Intel Corporation, Santa Clara, CA (US)

(72) Inventors: Holger Wenske, Freising (DE); Stephan Henzler, Munich (DE)

(73) Assignee: Intel Corporation, Santa Clara, CA (US)

( * ) Notice: Subject to any disclaimer, the term of this patent is extended or adjusted under 35 U.S.C. 154(b) by 923 days.

(21) Appl. No.: 15/083,915

(22) Filed: Mar. 29, 2016

(65) Prior Publication Data
US 2017/0288529 A1 Oct. 5, 2017

(51) Int. Cl.
*H02M 3/04* (2006.01)
*H03F 1/02* (2006.01)
*H03F 3/217* (2006.01)
*H02M 3/156* (2006.01)
*H02M 1/08* (2006.01)
*H02M 1/00* (2006.01)

(52) U.S. Cl.
CPC .............. *H02M 3/04* (2013.01); *H02M 1/08* (2013.01); *H02M 3/156* (2013.01); *H03F 1/0227* (2013.01); *H03F 3/217* (2013.01); *H02M 2001/007* (2013.01); *H02M 2001/0025* (2013.01); *H02M 2001/0077* (2013.01); *H03F 2200/102* (2013.01); *H03F 2200/432* (2013.01)

(58) Field of Classification Search
CPC .......... H02M 1/08; H02M 3/04; H02M 3/156; H02M 3/1563; H02M 3/158; H02M 3/1584; H02M 2001/0025; H02M 2001/007; H03F 1/0227; H03F 2200/432
See application file for complete search history.

(56) References Cited

U.S. PATENT DOCUMENTS 7,161,331 B2 * 1/2007 Wai ........................ H02M 1/34
323/222
2002/0114173 A1 8/2002 Hosotani et al.
(Continued)

FOREIGN PATENT DOCUMENTS

CN 108713284 10/2018
JP 0564449 3/1993
(Continued)

OTHER PUBLICATIONS

"International Application Serial No. PCT US2017 019693, International Search Report dated May 29, 2017", 3 pgs.
(Continued)

*Primary Examiner* — Matthew V Nguyen
(74) *Attorney, Agent, or Firm* — Schwegman Lundberg & Woessner, PA

(57) ABSTRACT

Some embodiments include apparatus and methods for using a direct-current to direct-current (DCDC) converter and a control unit coupled to the DCDC converter. The DCDC converter includes a first node to receive an input signal, a second node to couple to a terminal of an inductor, and a third node to couple to an output node. The DCDC converter includes a driver controlled by a signal. The control unit is arranged to generate control information based on a duty cycle of the signal to control the duty cycle range of the signal.

22 Claims, 4 Drawing Sheets

(56) References Cited

U.S. PATENT DOCUMENTS

| | | |
|---|---|---|
| 2008/0253152 A1 | 10/2008 | D'angelo et al. |
| 2011/0157921 A1 | 6/2011 | Lo et al. |
| 2011/0273152 A1* | 11/2011 | Weir ............... H02M 1/143 |
| | | 323/282 |
| 2012/0250361 A1 | 10/2012 | Hu et al. |

FOREIGN PATENT DOCUMENTS

| | | | |
|---|---|---|---|
| WO | WO-2007057817 A2 * | 5/2007 | ............ G11B 19/20 |
| WO | 2017172162 | 10/2017 | |

OTHER PUBLICATIONS

"International Application Serial No. PCT US2017 019693, Written Opinion dated May 29, 2017", 7 pgs.
"International Application Serial No. PCT US2017 019693, International Preliminary Report on Patentability dated Oct. 11, 2018", 9 pgs.

\* cited by examiner

DUTY CYCLE RANGE CONTROL FOR ENVELOPE TRACKING SWITCHING REGULATORS

TECHNICAL FIELD

Embodiments described herein pertain to power management. Some embodiments relate to direct-current to direct-current (DCDC) converters.

BACKGROUND

Many electronic devices and systems have DCDC converters to convert a power level from a source (e.g., a battery) and generate another power level in the form of an output signal, which can be used by components of the system. Some conventional DCDC converters use switches as part of operations to generate of the output signal. In order to maintain proper operations, some DCDC converters may restrict switching signals that control the switches. DCDC converters can also be used as an amplifier in which the converter output signal (e.g., output voltage) is not constant, but it is dependent on a varying input signal. These DCDC converters may also limit the maximum possible voltage swing of the output signal in order to avoid serious signal degradation. Moreover, some conventional DCDC converters may need high effort evaluation and tuning on a system level. Supply voltage margins in some conventional DCDC converters may also be needed. All these factors may lead to power inefficiency of the system.

DETAILED DESCRIPTION

The techniques described herein pertain to high-speed DCDC converters which can be used as part of power amplifiers to generate low-distortion high-bandwidth signals of a specific quality. The described DCDC converters can convert an input signal (e.g., analog signal) into an equivalent duty cycle of one or more switching signals. The pulse width modulated signal (or signals) can be filtered by an L-C output filter in order to generate an output signal.

As mentioned above, the range of switching signals in some conventional DCDC converters is restricted to helps maintaining proper operation of the DCDC converters. The conventional techniques may also limit the maximum possible voltage swing of the output signal to be less than the range of the supply voltage. This helps avoid a situation where the switching of the DCDC converter may stop and the control loop of the DCDC converter may saturate. Saturation can cause serious degradation of signal quality such as clipping, increased noise floor, non-linear distortion and spectral regrowth. High effort evaluation and tuning on system level and margins in supply voltage in conventional DCDC converters may also be needed. Thus, in some conventional DCDC converters achieving power efficiency may be difficult.

The techniques described herein allow DCDC converters to use nearly a full supply voltage range and duty cycle range of a switching signal. DCDC converters often have DCDC parameters, such as supply voltage, shift voltage in envelope tracker, and clipping the level of the input signal. In the techniques described herein, such DCDC parameters can be adapted (e.g., dynamically adjusted) to operating conditions and signal swing (e.g., background adaption to operating condition and signal power and statistics). A control loop in the described DCDC converters can monitor changes and extreme conditions in the duty cycle of the switching signal. Based on the monitoring, the control loop can adjust (e.g., tune) parameters (e.g., DCDC parameters) in order to maintain the quality of the output signal and allow the system to operate at or near optimal efficiency. This further increases the reliability and usability of the described DCDC converters. Moreover, in comparison with some conventional techniques, setup and calibration of the system that includes the described DCDC converters may be simpler, faster, and derive higher power efficiency.

Figure 1:
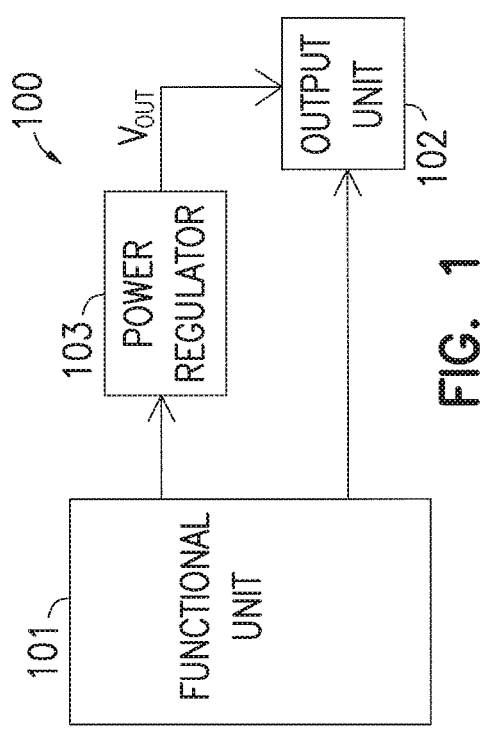
FIG. 1 shows an apparatus including a functional unit, an output unit, and a power regulator, according to some embodiments described herein.

FIG. 1 shows an apparatus 100 including a functional unit 101, an output unit 102, and a power regulator 103, according to some embodiments described herein. Apparatus 100 can include or be included in an electronic device or system, such as a computer (e.g., server, desktop, laptop, or notebook), tablet, a cellular phone, a wireless communication router, a digital television, or other electronic devices or systems.

Functional unit 101 can include components to generate signals, which can include baseband signals, radio frequency (RF) signals, or other types of signals. Output unit 102 can include components to transmit the signals (generate by functional unit 101) to another device or system. The components of output unit 102 include circuitry (e.g., power amplifiers) that may use power (e.g., voltage) provided by a signal (e.g., timing varying voltage signal) $V_{OUT}$. Power regulator 103 can include components to control (e.g., regulate) the value of the voltage provided by signal $V_{OUT}$. Power regulator 103 can operate to adjust parameters (e.g., DCDC converter parameters) in at least a portion of apparatus 100 to compensate for operating changes in operating conditions in order to maintain power efficiency of apparatus 100.

Power regulator 103 can include the power regulators described below with reference to FIG. 2A through 4.

Figure 2B:
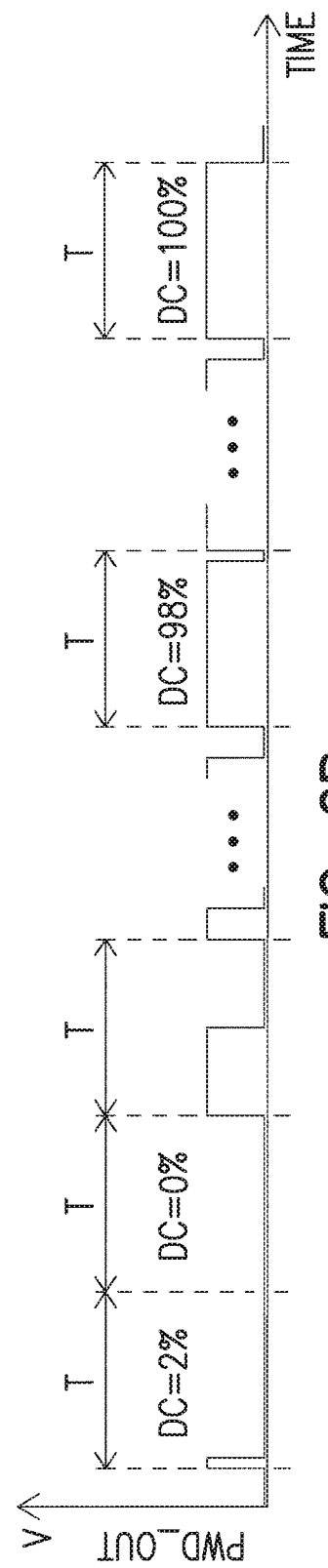
FIG. 2B shows example duty cycles of a switching signal of the DCDC converters of FIG. 2A, according to some embodiments described herein.
Figure 2A:
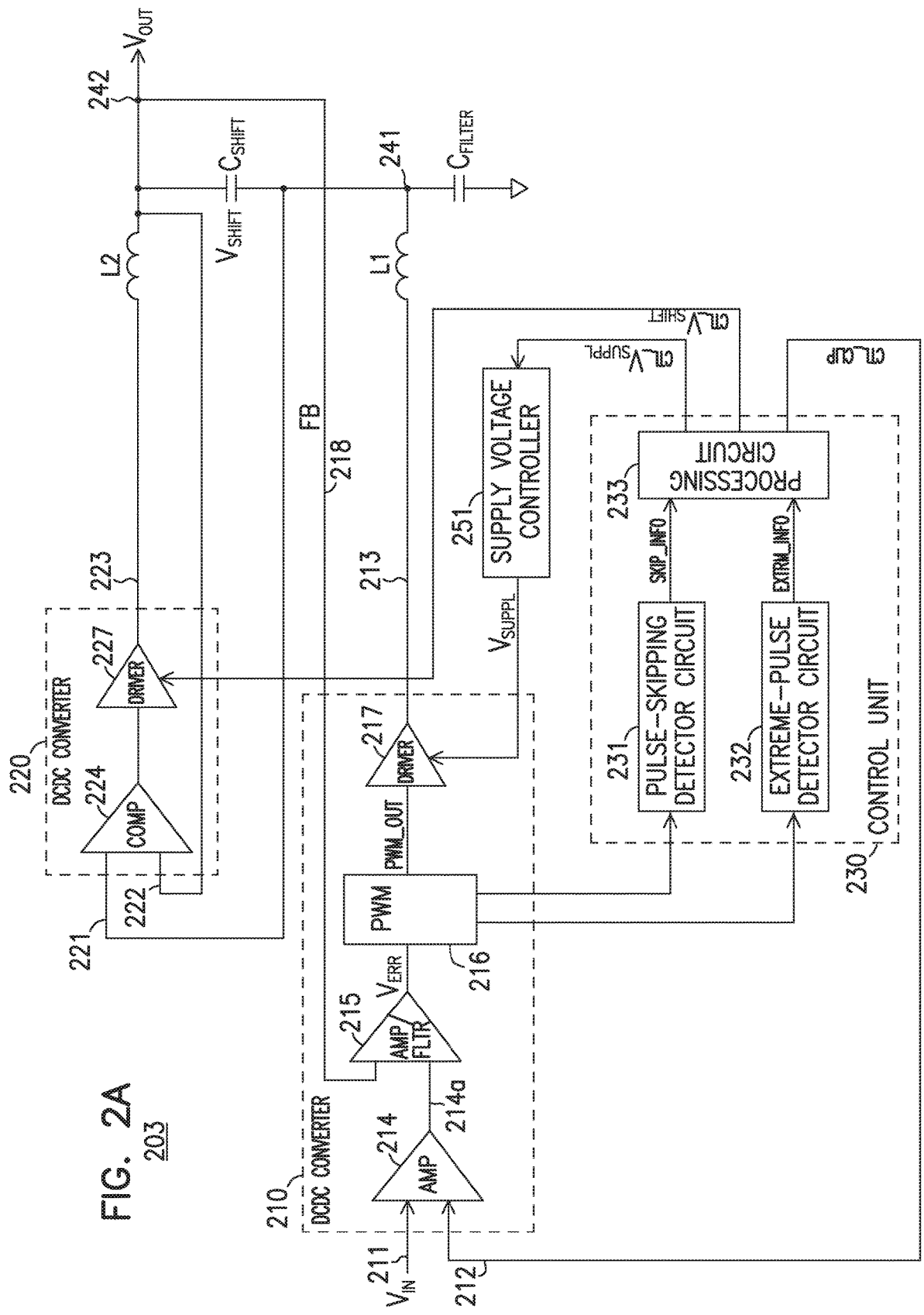
FIG. 2A shows a power regulator including DCDC converters and a control unit, according to some embodiments described herein.

FIG. 2A shows a power regulator 203 including converters 210 and 220, and a control unit 230, according to some embodiments described herein. Power regulator 203 can correspond to power regulator 103 of FIG. 1. In FIG. 2A, each of converters 210 and 220 can include a DCDC converter. Converters 210 and 220 can operate at different speeds (e.g., switching frequencies). For example, converter 210 can operate at a higher speed than that of converter 220.

Converter 220 can operate as a current source that delivers an average output current and generates a signal (e.g., output signal) $V_{OUT}$. Voltage $V_{OUT}$ can be provided to another component (e.g., a power amplifier) as a supply voltage of that component. Converter 210 can operate to amplify a signal $V_{IN}$ (e.g., a low swing analog signal) and maintain the overall signal quality based at least in part on feedback information FB, which can be generated based on signal $V_{OUT}$. Convert 210 can generate a signal PWM_OUT (e.g., a switching signal) which is a pulse width modulated signal. The duty cycle of signal PWM_OUT can be controlled (e.g., dynamically adjusted) during operation of power regulator 203, such that signal $V_{OUT}$ can follow signal $V_{IN}$ within an acceptable error.

Power regulator 203 can include a capacitor $C_{SHIFT}$ coupled between output paths of converters 210 and 220 to avoid a DC current from the output of converter 210 and to allow some voltage shift to the output voltage provided by signal $V_{OUT}$. This allows converter 210 to operate with a supply voltage (e.g., $V_{SUPPL}$) that can have a lower value than the value of the output voltage of converter 220 (e.g., the supply voltage of the power amplifier). The value of a voltage (e.g., $V_{SHIFT}$ across capacitor $C_{SHIFT}$ can be controlled by converter 220, which is coupled to the control loop of converter 210.

Control unit 230 can operate to generate control information CTL_$V_{SUPPL}$, CTL_$V_{SHIFT}$, and CTL_CLIP based on the duty cycle of signal PWM_OUT. Changes in operating conditions, such as changes in load conditions, supply voltage, and temperature, and other operating changes, may cause the duty cycle of signal PWM_OUT to change. Control unit 230 can monitor the duty cycle of signal PWM_OUT to compensate for changes in operating conditions. Control unit 230 can adjust (e.g., tune) the values of control information CTL_$V_{SUPPL}$, CTL_$V_{SHIFT}$, and CTL_CLIP in order to adjust the duty cycle range of signal PWM_OUT. This allows maintaining the quality of the output signal and improving the power efficiency of the system that includes power regulator 203. Control information CTL_$V_{SUPPL}$, CTL_$V_{SHIFT}$, and CTL_CLIP can also be used during a training phase of the system in order to find the optimum operating range of the system.

As shown in FIG. 2A, converter 210 can include a node (e.g., input node) 211 to receive signal $V_{IN}$, a node 212 (e.g., input node) to receive control information CTL_CLIP, and a node 213 that can be coupled to a terminal of an inductor L1. Inductor L1 has another terminal coupled to a terminal of a capacitor $C_{FILTER}$ at a node 241. Inductor L1 and capacitor $C_{FILTER}$ can form an L-C network (e.g., L-C filter) between node 213 and ground.

Converter 210 can include an amplifier (AMP) 214, an error amplifier (AMP/FLTR) 215 (which can contain a filter function (e.g., an integrator), a pulse width modulator (PWM) 216, and a driver 217. Driver 217 can include a complementary metal-oxide semiconductor (CMOS) inverter-based driver or other types of drivers. Amplifier (e.g., a pre-amplifier) 214 can include input nodes coupled to nodes 211 and 212, and an output node 214a coupled to an input of error amplifier 215. Error amplifier 215 can include an input coupled to a node 218 to receive feedback information FB from a feedback path coupled to converter 220. Error amplifier 215 can generate a signal $V_{ERR}$ (e.g., error signal) at its output node based on the values of the signal at the output of amplifier 214 and feedback information FB. PWM 216 can operate to generate signal PWM_OUT based on the value of signal $V_{ERR}$. Signal PWM_OUT can be used to control the switching (e.g., turn on or turn off) of driver 217 as part of the operation of power regulator 203 to generate signal $V_{OUT}$.

Converter 220 can include a node (e.g., input node) 221 that can be coupled to inductor L1 at node 241, a node (e.g., input node) 222 that can be coupled to a terminal of an inductor L2 at a node 242. Node 242 can be an output node of power regulator 203 to generate signal $V_{OUT}$. Converter 220 can include a comparator (COMP) 224 and a driver 227. Comparator 224 can include input nodes coupled to nodes 221 and 222. Comparator 224 can generate a signal at its output that can be used to control a switching of driver 227. The output of driver 227 can be coupled to a terminal of inductor L2 at node 223. Driver 227 can include a CMOS inverter-based driver or other types of drivers.

Inductors L1 and L2 and capacitors $C_{SHIFT}$ and $C_{FILTER}$ can be on-chip (e.g., on-die) or off-chip (on circuit board) components. For example, inductors L1 and L2 and capacitors $C_{SHIFT}$ and $C_{FILTER}$ can be located on a circuit board and the rest of power regulator 203 can be located on a die (e.g., one-die components). The die can include a semiconductor die. In another example, some of inductors L1 and L2 and capacitor $C_{SHIFT}$ and $C_{FILTER}$ (e.g., inductors L1 and L2) may be on-die components and the rest (e.g., $C_{SHIFT}$ and $C_{FILTER}$) of inductors L1 and L2 and capacitors $C_{SHIFT}$ and $C_{FILTER}$ can be off-die components (e.g., located on a circuit board).

As shown in FIG. 2A, control unit 230 can include a pulse-skipping detector circuit 231 and an extreme-pulse detector circuit 232 to generate information SKIP_INFO and EXTRM_INFO, respectively, based on duty cycle information from PWM 216 (e.g., from the duty cycle of signal PWM_OUT). Control unit 230 can include a processing circuit 233, which can include an adaptive algorithm (e.g., software), hardware (e.g., logic circuitry) or combination of both, to generate control information CTL_$V_{SUPPL}$, CTL_$V_{SHIFT}$, and CTL_CLIP based on information SKIP_INFO and EXTRM_INFO.

FIG. 2A shows pulse-skipping detector circuit 231 and extreme-pulse detector circuit 232 as part of control unit 230 as an example. In an alternative arrangement, pulse-skipping detector circuit 231, extreme-pulse detector circuit 232, or both can be part of another component of power regulator 203. For example, pulse-skipping detector circuit 231 and extreme-pulse detector circuit 232 can be part of PWM 216.

Control information CTL_$V_{SUPPL}$, CTL_$V_{SHIFT}$, and CTL_CLIP can be used to control (e.g., adjust) the values of parameters (e.g., DCDC parameters) of power regulator 203. Such parameters can include voltage $V_{SUPPL}$, voltage shift, and clipping (e.g., soft clipping) of signal $V_{IN}$. For example, control information CTL_$V_{SUPPL}$ can be used by a supply voltage controller 251 to adjust (e.g., increase or decrease) a value of a voltage (e.g., supply voltage) $V_{SUPPL}$ used by driver 217. Supply voltage controller 251 can include or can be part of a power management unit, which may generate voltage $V_{SUPPL}$ from a battery. Control information CTL_$V_{SHIFT}$ can be used to adjust (e.g., increase or decrease) a value of a voltage $V_{SHIFT}$ across capacitor $C_{SHIFT}$. Control information CTL_CLIP can be used to modify the amplitude of signal $V_{IN}$ (e.g., clip the high peaks of signal $V_{IN}$).

FIG. 2B shows example duty cycles of signal PWM_OUT of FIG. 2A, according to some embodiments described herein. As shown in FIG. 2B, signal PWM_OUT has a period T and different example duty cycles such as 0%, 22%, 98%, and 100% at different times. During operation of converter 210, signal PWM_OUT may have pulses having a very small duty cycle (e.g., close to 0%, such as 2%) or pulses having a very large duty cycle (e.g., close to 100% duty cycle, such as 98%). These pulses can be considered as extreme-pulses. Signal PWM_OUT may also have pulses having 0% duty cycle or 100% duty cycle. These pulses can be considered as skipped pulses (or missing pulses). This means that signal PWM_OUT may skip switching during the periods where pulses having 0% duty cycle or 100% duty cycle occur.

In FIG. 2A, pulse-skipping detector circuit 231 can identify missing pulses (pulses having a 0% or 100% duty cycle). If a missing pulse occurs, pulse-skipping detector circuit 231 can distinguish whether the missing pulse has a 0% or 100% duty cycle. Information SKIP_INFO generated by pulse-skipping detector circuit 231 can contain information that identifies missing pulses and the duty cycle (e.g., 0% or 100%) of the missing pulses.

Extreme-pulse detector circuit 232 can identify pulses having an extreme duty cycle (e.g., pulses having very small duty cycle (e.g., closer to 0% duty cycle) or very large duty cycle (e.g., close to 100% duty cycle). Extreme-pulse detector circuit 232 can also identify how often the pulses having a very small or value large duty cycle occur. Information EXTRM_INFO generated by extreme-pulse detector circuit 232 can contain information that identifies whether pulses having a very small or very large duty cycle occur, and how often they occur.

Power regulator 203 can include a control loop that includes at least a portion of converter 210 (e.g., error amplifier 215 and PWM 216), the feedback path (e.g., circuit path between nodes 218 and 242) that provides feedback information FB, and control unit 230. As described above, changes in operating conditions (e.g., changes in load conditions, supply voltage, and temperature) may cause the duty cycle of signal PWM_OUT to change. For extreme conditions, the duty cycle can reach 0% or 100%. This may impede the operation of the control loop. In order to correct (e.g., compensate for) these extreme conditions, control unit 230 can operate to adjust the values of control information CTL_$V_{SUPPL}$, CTL_$V_{SHIFT}$, and CTL_CLIP. This allows adjustment of parameters (e.g., supply voltage, shift voltage in envelope tracker, and clipping level of input signal), thereby allowing the duty cycle to move back to an acceptable (e.g., safe) duty cycle order to maintain proper operation and improve power efficiency of power regulator 203. For example, based on information SKIP_INFO, control unit 230 can adjust the values of control information CTL_$V_{SUPPL}$, CTL_$V_{SHIFT}$, and CTL_CLIP, such that an adjustment (e.g., tuning) operation can be performed to shift the system towards less pulse skipping. In another example, based on information EXTRM_INFO, control unit 230 can adjust the values of control information CTL_$V_{SUPPL}$, CTL_$V_{SHIFT}$, and CTL_CLIP, such that an adjustment operation can be performed to shift the system towards more pulse skipping.

Control unit 230 can also adjust the values of control information CTL_$V_{SUPPL}$, CTL_$V_{SHIFT}$, and CTL_CLIP to allow selection of which tuning operation can be performed, depending on whether 0%, 100%, or both skipping events occur. For example, if there are only skipping events on one side (either 0% or 100%), tuning of the shift voltage (e.g., $V_{SHIFT}$) or supply voltage (e.g., $V_{SUPPL}$) can be used. If skipping events occur on both sides (0% and 100%), adjustment (e.g., clipping) of the input signal (e.g., signal $V_{SHIFT}$) may be used.

The duty cycle range of signal PWM_OUT can be determined by parameters that include the supply voltage (e.g., voltage $V_{SUPPL}$) of converter 210, the voltage across capacitor $C_{SHIFT}$ (e.g., voltage $V_{SHIFT}$), the signal swing (e.g., $V_{IN\_PEAKPEAK}$), and the gain of the control loop. The relationship among $V_{SUPPL}$ and $V_{IN\_PEAKPEAK}$ is as follows:

$$V_{SUPPL} > V_{IN\_PEAKPEAK} * \text{Gain}$$

where $V_{IN\_PEAKPEAK}$ is the peak-to-peak value of signal $V_{IN}$, Gain is the gain of the control loop, such that $V_{OUT} = V_{IN} * \text{Gain}$.

This can be also formulated as follows:
$V_{SUPPL} = V_{IN\_PEAKPEAK} * \text{Gain}/(\text{DutyCycleMax} - \text{DutyCycleMin})$, where DutyCycleMax is a selected maximum duty cycle of signal PWM_OUT, which can be the upper limit of the duty cycle. DutyCycleMin is a selected minimum duty cycle of signal PWM_OUT, which can be the lower limit of the duty cycle of signal PWM_OUT. Thus, the larger the duty cycle range (values from DutyCycleMin to DutyCycleMax) the smaller the $V_{SUPPL}$ needs to be. As an example, the duty cycle range of signal PWM_OUT can be selected to be from duty cycle (e.g., lower limit) to 98% duty cycle (upper limit). Other values for the duty cycle range can be used.

Voltage $V_{SHIFT}$ across capacitor $C_{SHIFT}$ can determine the placement of the output signal swing of converter 210 inside its output range and thus duty cycle range. A lower value of voltage $V_{SHIFT}$ can shift the signal swing up and vice versa because the control loop can keep the output voltage in the fixed ratio of $V_{OUT} = V_{IN} * \text{Gain}$.

If the value of voltage $V_{SHIFT}$ is not set correctly according to the input signal (e.g., $V_{IN}$), asymmetry in the used duty cycle may happen and an overdrive at one rail may occur.

Values of parameters (e.g., voltage $V_{SUPPL}$, voltage $V_{SHIFT}$, and duty cycle range) of power regulator 203 can be selected from (e.g., initialized with) useful default values, which can be derived from simulation or from lab evaluation. In case of exceedance of the selected (e.g., default) duty cycle range, the parameters can be adjusted and can be used until no further error is detected. For costly parameters as the supply voltage a lossy integrator behavior can be implemented to slowly return to the default values.

The following is an example sequence in the operation of power regulator 203. This example assumes that the lower limit and upper limit of the duty cycle range is selected (e.g., predetermined) to be 2% duty cycle and 98% duty cycle, respectively.

In this example, extreme-pulse detector circuit 232 can provide information EXTRM_INFO to processing circuit 233 if the duty cycle (DC) falls below 2% (is less than 2%) and is greater than 0% (e.g., 0%<DC<2%) or if the duty cycle exceeds 98% (is greater than 98%) and is less than 100% (e.g., <98%<DC<100%). Pulse-skipping detector circuit 231 can provide information SKIP_INFO to processing circuit 233 if the duty cycle reaches 0% or 100% (e.g., DC=0% or DC=100%).

Thus, pulse-skipping detector circuit 231 and extreme-pulse detector circuit 232 can operate to determine (e.g., detect) whether the duty cycle of signal PWM_OUT is outside a duty cycle range (e.g., 0%<DC<2% and <98%<DC<100%) or whether the duty cycle reaches at least one of 0% and 100%.

In this example, based on control information CTL_$V_{SHIFT}$, an adjustment operation can be performed to adjust the setting of the shift voltage $V_{SHIFT}$ to have enough margin to both rails. If the adjustment of voltage $V_{SHIFT}$ is insufficient to obtain the intended (e.g., desired) duty cycle range, then an adjustment can be performed (e.g., performed by supply voltage controller 251 based on control information CTL_$V_{SUPPL}$) to adjust (e.g., increase) the value of voltage $V_{SUPPL}$.

Alternatively, based on control information CTL_CLIP, an adjustment operation can be activated to modify the amplitude of signal $V_{IN}$, such as by clipping one side inside of amplifier 214 (assuming that signal $V_{IN}$ and amplifier 214 are arranged for such clipping). For example, the envelope signal used for supplying the power amplifier (that can be coupled to node 242 in FIG. 2A) usually has a high crest factor and rare positive peaks. Such a clipping (e.g., a soft clipping) may have negligible or no influence in the overall signal quality. Thus, a clipping at the low side can be eliminated by lowering the shift voltage (e.g., $V_{SHIFT}$). After that the clipping level in amplifier 214 can be lowered until the clipping at the high side disappears. Further, control information CTL_CLIP can also be generated to selectively modify an upper or lower range of signal $V_{IN}$ if the duty cycle of signal PWM_OUT is less than a lower limit or greater than an upper limit.

In an example arrangement, control unit 230 can be arranged to provide multiple signals (e.g., as part of control information CTL_$V_{SUPPL}$) in which one signal can indicate whether the upper limit of the duty cycle is reached and another signal can indicate whether a 100% duty cycle is reached. In this arrangement, during operation, the value of voltage $V_{SUPPL}$ can be decreased until the signal indicating the upper limit of the duty cycle is asserted but the signal indicating 100% duty cycle is not asserted. This arrangement may further improve power efficiency of the supply voltage for the given signal swing.

As described above with reference to FIG. 2A and FIG. 2B, control unit 230 can operate to generate control information (e.g., CTL_$V_{SUPPL}$, CTL_$V_{SHIFT}$, and CTL_CLIP) based on the duty cycle of signal PWM_OUT of a control loop of power regulator 203. The control information can be used to adjust parameters, such as supply voltage, shift voltage in an envelope tracker, and input signal. This allows controlling the duty cycle to be within a duty cycle range in order to maintain proper operation and improve power efficiency of power regulator 203.

Figure 3:
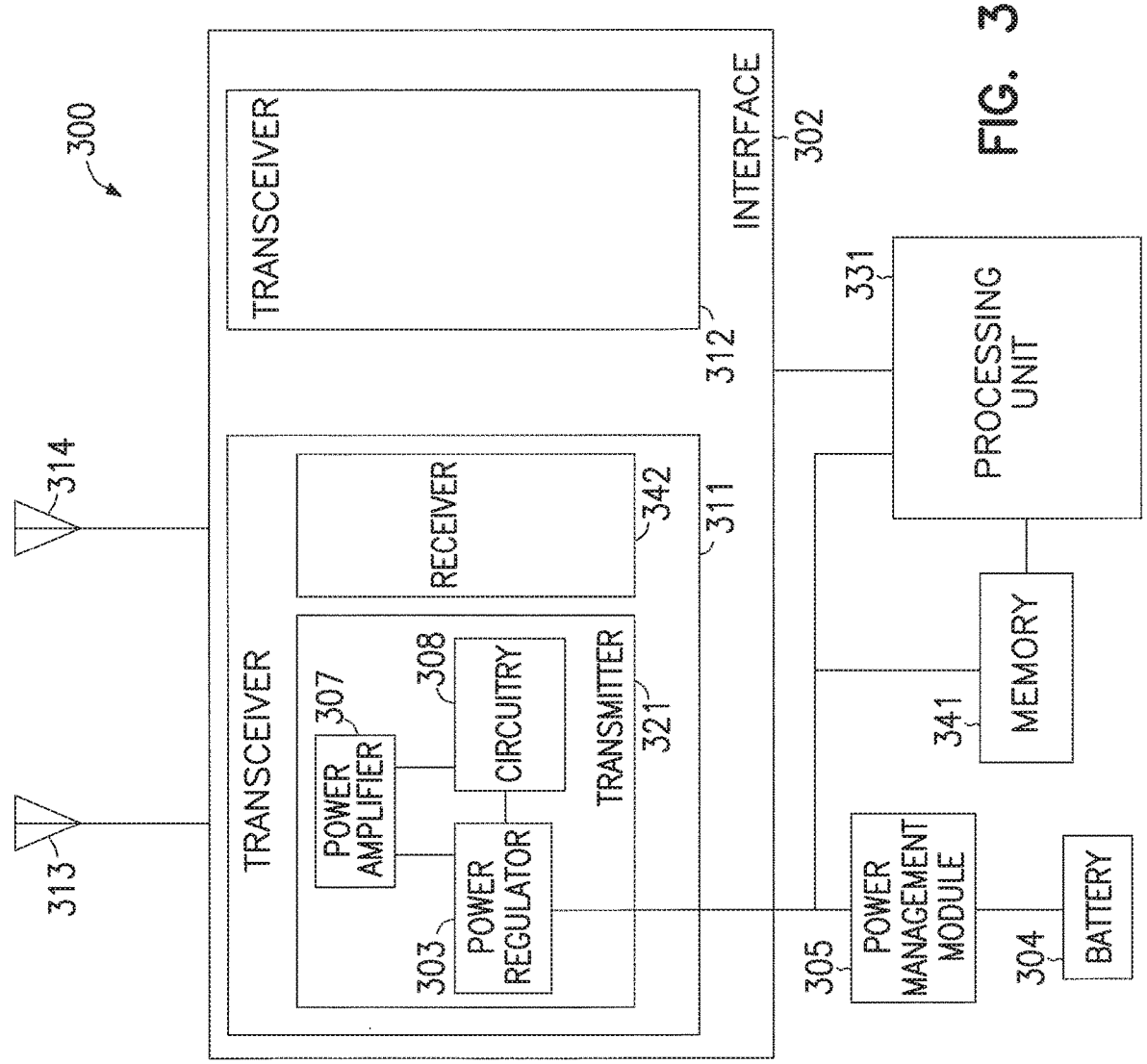
FIG. 3 shows an apparatus in the form of an electronic system including an interface and a power regulator, according to some embodiments described herein.

FIG. 3 shows an apparatus in the form of an electronic system 300 including an interface 302, and power regulator 303, according to some embodiments described herein. System 300 can also include a battery 304, a power management module 305, antennas 313 and 314, a processing unit 331, and a memory 341. Interface 302 can include transceivers 311 and 312. For simplicity, FIG. 3 omits other elements of system 300 to not obscure the embodiments described herein. For example, system 300 can include one or more of a keyboard, a display (e.g., an LCD screen including a touch screen), a non-volatile memory port (e.g., a Universal Serial Bus (USB) port), High-Definition Multimedia Interface (HDMI) port, a graphics processor, an application processor, speakers, and other components.

System 300 can include user equipment, a laptop or portable computer with wireless communication capability, a web tablet, a cellular telephone, a wireless headset, a digital camera, an access point, a wireless communication router, a television, a medical device (e.g., a heart rate monitor, a blood pressure monitor, etc.), or other device that may communicate (send, receive, or both) information wirelessly.

Power management module 305 can manage and provide power from battery 304 to other components of system 300. Power regulator 303 can include power regulator 203 (FIG. 2A). Thus, power regulator 303 can include components and operations of power regulator 203 described above with reference to FIG. 2A and FIG. 2B, such components including DCDC converters 210 and 220, control unit 230, and inductors L1 and L2 and capacitors $C_{SHIFT}$ and $C_{FILTER}$ (FIG. 2A). FIG. 3 shows an example where power regulator 303 is part of transceiver 311. However, at least a portion of power regulator 303 (e.g., a portion excluding some or all of inductors L1 and L2 and capacitors $C_{SHIFT}$ and $C_{FILTER}$) can be part of another component of system 300, such as part of power management module 305.

Processing unit 331 and interface 302 can be configured to communicate with a single type of communication network or multiple types of communication networks. For example, processing unit 331 and interface 302 can be configured to communicate with one or more of WiFi, WiMax, LTE, and other communication networks.

Processing unit 331 can include a single processor or multiple processors. The processor or processors can include one or more general purpose processors, one or more application-specific integrated circuits (ASICs), or other types of processors. Processing unit 331 can configure messages for transmission by interface 302 to other devices. Processing unit 331 can be configured to communicate with the interface 302 to wirelessly exchange messages with other devices.

Memory 341 can include volatile memory, non-volatile memory, or a combination of both. Memory 341 can contain instructions (e.g., firmware programs, software programs, or a combination of both), which when executed by processing unit 331, result in system 300 performing operations. Such operations may include wirelessly transmitting, receiving, or both, signals to or from system 300 through antennas 313 and 314.

Each of transceivers 311 and 312 can be configured to communicate with a different network. For example, transceiver 311 can be configured to communicate with a long term evolution (LTE) network, and transceiver 312 can be configured to communicate with a WiMax network. FIG. 3 shows an example where system 300 includes two transceivers (e.g., 311 and 312) and two antennas (e.g., 313 and 314). The number of transceivers and antennas can vary.

Transceiver 311 may include a transmitter 321 and a receiver 342 to wirelessly exchange (e.g., send and receive) messages with other devices shown in FIG. 3) through at least one of antennas 313 and 314 in at least one of the networks described above. Transceiver 312 may also include a transmitter and a receiver (not shown in FIG. 3) to wirelessly exchange messages with other devices through at least one of antennas 313 and 314.

Transmitter 321 can be configured to operate in an LTE network or another single network or multiple networks among the networks described above (e.g., WiFi, WiMax, and other networks). At least one of transceivers 311 and 312 can include a power amplifier. For example, transmitter 321 of transceiver 311 can include power amplifier 307, which can include an RF power amplifier.

As shown in FIG. 3, transmitter 321 can include circuitry 308 to generate signals for transmission. Power amplifier 307 can receive signals (e.g., input signals) generated by circuitry 308 and provide signals (e.g., output signals) to at least one of antennas 313 and 314 for transmission. Power amplifier 307 can operate using a voltage provided by power regulator 303.

Transmitter 321 of transceiver 311 in FIG. 3 can include an OFDM transmitter, such that at least one of the signals generated by circuitry 308 can include an orthogonal frequency-division multiplexing (OFDM) signal. System 300 can be configured to operate in a multiple-input multiple-output (MIMO) configuration. Thus, power amplifier 307 can be coupled to multiple antennas of system 300 (e.g., at least antennas 313 and 314) for MIMO transmissions. The signals generated by circuitry 308 can include precoded OFDM signals for MIMO transmissions.

Further, transmitter 321 can also include a MIMO transmitter arranged to transmit OFDM signals over an uplink channel using a plurality of antenna ports (e.g., antenna ports associated with antennas 313 and 314). The MIMO transmitter can include at least one RF power amplifier (e.g., power amplifier 307) associated with each of the antenna ports.

In FIG. 3, antennas 313 and 314 can include one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures can be used. In such embodiments, each aperture can be considered a separate antenna. In some MIMO embodiments, the antennas can be effectively separated to take advantage of spatial diversity and the different channel characteristics that may result between each of the antennas and the antennas of a transmitting station. In some MIMO embodiments, the antennas may be separated by up to 1/10 of a wavelength or more.

Although system 300 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Embodiments described herein can be implemented in one or a combination of hardware, firmware and software. Embodiments described herein can also be implemented as instructions stored on a computer-readable storage medium, which may be read and executed by at least one processor to perform the operations described herein. A computer-readable storage medium may include any non-transitory mechanism for storing information in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors of system 300 may be configured with the instructions to perform the operations described herein.

Figure 4:
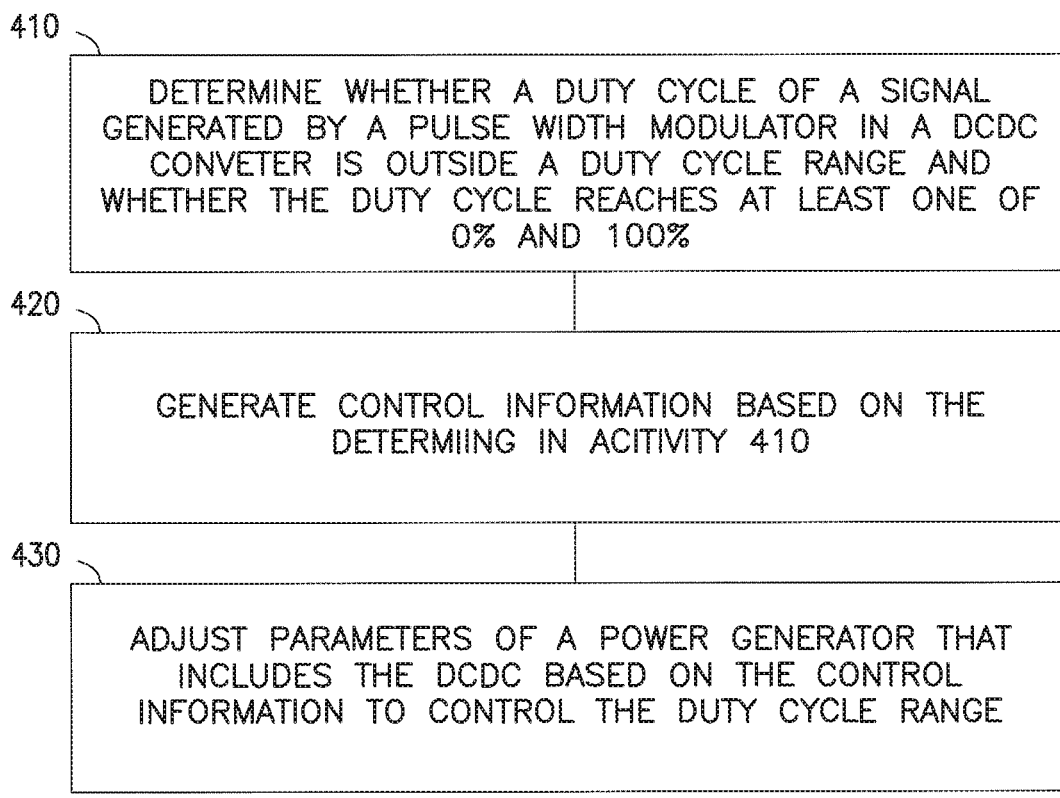
FIG. 4 is a flowchart showing a method of operating an electronic apparatus, according to some embodiments described herein.

FIG. 4 is a flowchart showing a method 400 of operating an electronic apparatus, according to some embodiments described herein. The electronic apparatus used in method 400 can include apparatuses described above with reference to FIG. 1 through FIG. 3, such as apparatus 100 and system 300 that can include power regulator 203 and its components (e.g., converters 210 and 220, and control unit 230). Some of the activities in method 400 may be performed by hardware, software, firmware, or any combination of hardware, software, and firmware.

As shown in FIG. 4, activity 410 of method 400 can include determining whether a duty cycle of a signal generated by a pulse width modulator in a DCDC converter is outside a duty cycle range and whether the duty cycle reaches at least one of 0% and 100%. Activity 420 can include generating control information based on the determining in activity 410. Activity 430 can include adjusting parameters of a power regulator that includes the DCDC converter based on the control information to control the duty cycle range.

Method 400 can include fewer or more activities relative to activities 410, 420, and 430 in FIG. 4. For example, method 400 can include activities and operations of apparatus 100 and system 300 that can include power regulator 203 and its components (e.g., converters 210 and 220, and control unit 230), described above with reference to FIG. 1 through FIG. 3.

The illustrations of the apparatuses (e.g., apparatus 100 and system 300 that can include power regulator 203 and its components (e.g., converters 210 and 220, and control unit 230) and methods (e.g., method 400 and operations of apparatus 100 and system 300 that can include power regulator 203 and its components (e.g., converters 210 and 220, and control unit 230) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), wearable electronic things (e.g., smart watches), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

Additional Notes and Examples

Example 1 includes subject matter (such as a device, an electronic apparatus (e.g., circuit, electronic system, or both), or a machine) including a direct-current to direct-current (DCDC) converter including a first node to receive an input signal, a second node to couple to a terminal of an inductor, and a third node to couple to an output node, the DCDC converter including a driver controlled by a signal, and a control unit to generate control information based on a duty cycle of the signal to control a duty cycle range of the signal.

In Example 2, the subject matter of Example 1 may optionally include, further comprising an additional DCDC converter including a first node to couple to an additional terminal of the inductor, a second node to couple to the output node and to a first terminal of an additional inductor, and a third node to couple to a second terminal of the additional inductor.

In Example 3, the subject matter of Example 2 may optionally include, wherein the control unit is arranged to generate the control information to adjust a value of a voltage across a capacitor coupled to the additional node of the inductor and the first node of the additional inductor if the duty cycle of the signal is less than a lower limit.

In Example 4, the subject matter of Example 2 may optionally include, wherein the control unit is arranged to generate the control information to adjust a value of a voltage across a capacitor coupled to the additional node of the inductor and the first node of the additional inductor if the duty cycle of the signal is greater than an upper limit.

In Example 5, the subject matter of any of Examples 1-4 may optionally include, wherein the control unit is arranged to generate the control information to adjust a value of a supply voltage of the driver if the duty cycle of the signal is less than a lower limit.

In Example 6, the subject matter of any of Examples 1-4 may optionally include, wherein the control unit is arranged to generate the control information to adjust a value of a supply voltage of the driver if the duty cycle of the signal is greater than an upper limit.

In Example 7, the subject matter of any of Examples 1-4 may optionally include, wherein the control unit is arranged to generate the control information to selectively modify an upper or lower range of the input signal if the duty cycle of the signal is less than a lower limit or greater than an upper limit.

In Example 8, the subject matter of any of Examples 1-4 may optionally include, wherein the control unit is arranged to generate the control information to modify an amplitude of the input signal if the duty cycle of the signal is less than a lower limit.

In Example 9, the subject matter of any of Examples 1-4 may optionally include, wherein the control unit is arranged to generate the control information to modify an amplitude of the input signal if the duty cycle of the signal is greater than an upper limit.

In Example 10, the subject matter of any of Examples 1-4 may optionally include, wherein the control unit is arranged to generate the control information based on detection of the duty cycle reaching at least one 0% and 100%.

In Example 11, the subject matter of any of Examples 1-4 may optionally include, wherein the control unit is arranged to generate the control information based on detection of the duty cycle being between a lower limit and 0%.

In Example 12, the subject matter of any of Examples 1-4 may optionally include, wherein the control unit is arranged to generate the control information based on detection of the duty cycle being between an upper limit and 100%.

In Example 13, the subject matter of any of Examples 2-4 may optionally include, wherein the DCDC converter and the additional DCDC converter are arranged to operate at different speeds.

Example 14 includes subject matter (such as a device, an electronic apparatus (e.g., circuit, electronic system, or both), or a machine) including an amplifier, an additional amplifier including a first input node coupled to an output node of the amplifier, and second input node to couple to a first terminal of an inductor, a pulse width modulator coupled to an output node of the additional amplifier, a first driver including an input node coupled to an output node of the pulse width modulator and an output node to couple to a first terminal of an additional inductor, a comparator including a first input node to couple to a second terminal of the inductor, and a second input node to couple to the first terminal of the additional inductor, a second driver including an input node coupled to an output node of the comparator, and an output node to a second terminal of the inductor, and a control unit to generate control information based on a duty cycle of a signal generated by the pulse width modulator.

In Example 15, the subject matter of Example 14 may optionally include, wherein the first input node of the comparator is arranged to couple to a terminal of a capacitor.

In Example 16, the subject matter of Example 14 may optionally include, wherein the second input node of the comparator is arranged to couple to an additional terminal of the capacitor.

In Example 17, the subject matter of Example 14 may optionally include, wherein the first input node of the comparator is arranged to couple to a terminal of an additional capacitor.

In Example 18, the subject matter of Example 16 may optionally include, wherein the second input node of the additional amplifier is arranged to couple to the additional terminal of the capacitor.

In Example 19, the subject matter of Example 14 may optionally include, wherein the control unit includes a detector circuit to detect occurrences of the duty cycle of 0% and the duty cycle of 100%.

In Example 20, the subject matter of Example 19 may optionally include, wherein the control unit includes another detector circuit to detect occurrences of the duty cycle being between a lower limit and 0% and duty cycle being between an upper limit and 100%.

In Example 21, the subject matter of Example 14 may optionally include, further comprising the inductor, the additional inductor, a first capacitor including a first terminal coupled to the first input node of the comparator and to the first terminal of the inductor, and a second terminal coupled to the second input node of the comparator and to the second terminal of the additional inductor, and a second capacitor including a first terminal coupled to the first input node of the comparator and to the second terminal of the additional inductor, and a second terminal coupled to ground Example 22 includes subject matter (such as a device, an electronic apparatus (e.g., circuit, electronic system, or both), or a machine) including a radio frequency (RF) power amplifier, and a power regulator coupled to the RF power amplifier, the power regulator including a first direct-current to direct-current (DCDC) converter including a first node to receive an input signal, a second node to couple to a first terminal of a first inductor, and a third node to couple to a first terminal of a second inductor, the first DCDC converter including a driver controlled by a signal, a second DCDC converter including a first node to couple to a second terminal of the first inductor, a second node to couple to the first terminal of the second inductor, and a third node to couple to a second terminal of the second inductor, and a control unit to generate control information based on a duty cycle of the signal to control a duty cycle range of the signal.

In Example 23, the subject matter of Example 22 may optionally include, wherein the RF power amplifier is part of an orthogonal frequency-division multiplexing (OFDM) transmitter.

In Example 24, the subject matter of Example 22 may optionally include, wherein the RF power amplifier is part of a multiple-input multiple-output (MUM) transmitter arranged to transmit orthogonal frequency-division multiplexing (OFDM) signals.

In Example 25, the subject matter of Example 22 may optionally include, wherein the electronic system comprises user equipment configured to operate in a long term evolution (LTE) network.

Example 26 includes subject matter (such as a method of operating a device, an electronic apparatus (e.g., circuit, electronic system, or both), or a machine) including determining whether a duty cycle of a signal generated by a pulse width modulator in a direct-current to direct-current (DCDC) converter is outside a duty cycle range and whether the duty cycle reaches at least one of 0% and 100%, generating control information based on the determining, and adjusting parameters of a power regulator based on the control information to control the duty cycle range.

In Example 27, the subject matter of Example 26 may optionally include, wherein the determining includes detecting whether the duty cycle is less than a lower limit of the duty cycle range and greater than 0%.

In Example 28, the subject matter of Example 27 may optionally include, wherein the determining includes detecting whether the duty cycle is greater than an upper limit of the duty cycle range and less than 100%.

In Example 29, the subject matter of Example 26 may optionally include, wherein further comprising adjusting, based on the control information, a shift voltage on an output path of the DCDC converter.

In Example 30, the subject matter of Example 26 may optionally include, wherein further comprising adjusting, based on the control information, a supply voltage of a driver of the DCDC controlled by the signal.

In Example 31, the subject matter of Example 30 may optionally include, wherein further comprising clipping an input signal at an input node of the DCDC converter.

Example 32, includes subject matter (such as a device, an electronic apparatus (e.g., circuit, electronic system, or both), or machine) including means for performing any of the methods of Examples 26-31.

The subject matter of Example 1 through Example 31 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a direct-current to direct-current (DCDC) converter including a first node to receive an input signal, a second node to couple to a terminal of an inductor, and a third node to couple to an output node, the DCDC converter including a driver controlled by a signal;
   a control unit to generate control information based on a duty cycle of the signal to control a duty cycle range of the signal; and
   an additional DCDC converter including a first node to couple to an additional terminal of the inductor, a second node to couple to the output node and to a first terminal of an additional inductor, and a third node to couple to a second terminal of the additional inductor.

2. The apparatus of claim 1, wherein the control unit is arranged to generate the control information to adjust a value of a voltage across a capacitor coupled to the additional terminal of the inductor and the first terminal of the additional inductor if the duty cycle of the signal is less than a lower limit.

3. The apparatus of claim 1, wherein the control unit is arranged to generate the control information to adjust a value of a voltage across a capacitor coupled to the additional terminal of the inductor and the first terminal of the additional inductor if the duty cycle of the signal is greater than an upper limit.

4. The apparatus of claim 1, wherein the control unit is arranged to generate the control information to adjust a value of a supply voltage of the driver if the duty cycle of the signal is less than a lower limit.

5. The apparatus of claim 1, wherein the control unit is arranged to generate the control information to adjust a value of a supply voltage of the driver if the duty cycle of the signal is greater than an upper limit.

6. The apparatus of claim 1, wherein the control unit is arranged to generate the control information based on detection of the duty cycle reaching at least one of 0% and 100%.

7. The apparatus of claim 1, wherein the control unit is arranged to generate the control information based on detection of the duty cycle being between a lower limit and 0%.

8. The apparatus of claim 1, wherein the control unit is arranged to generate the control information based on detection of the duty cycle being between an upper limit and 100%.

9. The apparatus of claim 1, wherein the DCDC converter and the additional DCDC converter are arranged to operate at different speeds.

10. The apparatus of claim 1, wherein the DCDC converter includes:
    an amplifier coupled to the first node to receive the input signal; and
    an additional amplifier including a first input node coupled to an output node of the amplifier, a second input node to couple to a terminal of an addition inductor, and an output node coupled to an input node of the pulse width modulator.

11. The apparatus of claim 10, wherein the DCDC converter includes:
    a comparator including a first input node to couple to an additional terminal of the inductor, and a second input node to couple to the terminal of the additional inductor; and
    a second driver including an input node coupled to an output node of the comparator, and an output node to couple to an additional terminal of the additional inductor.

12. The apparatus of claim 11, wherein the first input node of the comparator is to couple to a terminal of a capacitor.

13. The apparatus of claim 12, wherein the second input node of the comparator is to couple to an additional terminal of the capacitor.

14. The apparatus of claim 13, wherein the first input node of the comparator is to couple to a terminal of an additional capacitor.

15. The apparatus of claim 13, wherein the second input node of the additional amplifier is to couple to the additional terminal of the capacitor.

16. The apparatus of claim 1, further comprising:
    a radio frequency (RI) power amplifier; and
    a power regulator coupled to the RF power amplifier, the power regulator including the DCDC converter and the control unit.

17. The apparatus of claim 16, wherein the RF power amplifier is part of an orthogonal frequency-division multiplexing (OFDM) transmitter.

18. The apparatus of claim 16, wherein the RF power amplifier is part of a multiple-input multiple-output (AMMO) transmitter arranged to transmit orthogonal frequency-division multiplexing (OFDM) signals.

19. The apparatus of claim 16, wherein the apparatus comprises user equipment configured to operate in a long term evolution (LTE) network.

20. An apparatus comprising:
- a direct-current to direct-current (DCDC) converter including a first node to receive an input signal, a second node to couple to a terminal of an inductor, and a third node to couple to an output node, the DCDC converter including a driver controlled by a signal; and
- a control unit to generate control information based on a duty cycle of the signal to control a duty cycle range of the signal wherein the control unit is arranged to generate the control information to selectively modify an upper or lower range of the input signal if the duty cycle of the signal is less than a lower limit or greater than an upper limit.

21. An apparatus comprising:
- a direct-current to direct-current (DCDC) converter including a first node to receive an input signal, a second node to couple to a terminal of an inductor, and a third node to couple to an output node, the DCDC converter including a driver controlled by a signal; and
- a control unit to generate control information based on a duty cycle of the signal to control a duty cycle range of the signal wherein the control unit is arranged to generate the control information to modify an amplitude of the input signal if the duty cycle of the signal is less than a lower limit.

22. An apparatus comprising:
- a direct-current to direct-current (DCDC) converter including a first node to receive an input signal, a second node to couple to a terminal of an inductor, and a third node to couple to an output node, the DCDC converter including a driver controlled by a signal; and
- a control unit to generate control information based on a duty cycle of the signal to control a duty cycle range of the signal wherein the control unit is arranged to generate the control information to modify an amplitude of the input signal if the duty cycle of the signal is greater than an upper limit.

* * * * *